Figure 1:
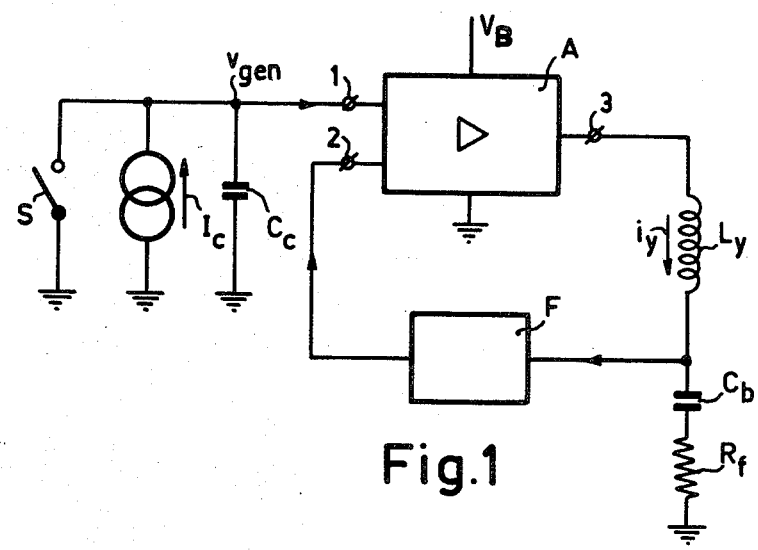

United States Patent [19]
Nillesen

[11] B 3,988,638
[45] Oct. 26, 1976

[54] CIRCUIT ARRANGEMENT FOR GENERATING A FIELD DEFLECTION CURRENT

[75] Inventor: Antonius Hendrikus Hubertus Jozef Nillesen, Eindhoven, Netherlands

[73] Assignee: U.S. Philips Corporation, New York, N.Y.

[22] Filed: Oct. 18, 1974

[21] Appl. No.: 516,002

[44] Published under the second Trial Voluntary Protest Program on January 13, 1976 as document No. B 516,002.

[30] Foreign Application Priority Data
Oct. 31, 1973 Netherlands .................. 7314926

[52] U.S. Cl. .............................. 315/388; 315/403
[51] Int. Cl.² .................. H01J 29/70; H01J 29/72
[58] Field of Search ............ 315/387, 388, 389, 403

[56] References Cited
UNITED STATES PATENTS

| 3,147,397 | 9/1964 | Michaelson | 315/387 |
|---|---|---|---|
| 3,515,933 | 6/1970 | Myers | 315/387 |
| 3,544,811 | 12/1970 | McDonald et al. | 315/388 |
| 3,553,478 | 1/1968 | Steinbacher et al. | 315/387 |

Primary Examiner—T.H. Tubbesing
Assistant Examiner—T. M. Blum
Attorney, Agent, or Firm—Frank R. Trifari; Henry I. Steckler

[57] ABSTRACT

A field output circuit in which for preventing vertical bounce of the picture and of linearity errors a feedback alternating current path is provided which includes a field frequency clamping circuit. In one embodiment the clamping circuit may be formed by the field oscillator constituted as a capacitive sawtooth generator.

6 Claims, 9 Drawing Figures

CIRCUIT ARRANGEMENT FOR GENERATING A FIELD DEFLECTION CURRENT

The invention relates to a circuit arrangement for generating a sawtooth deflection current in a field deflection coil of a television display tube, comprising a generator for applying a sawtooth-shaped control signal to a first input terminal of an amplifier with an output terminal coupled to the deflection coil and with at least a second input terminal for coupling a feedback path for very low frequencies and a feedback path for higher frequencies.

Such a circuit arrangement is known from U.S. Pat. No. 3,434,004 (PHN 1254) in which the connection of the deflection coil not connected to the output terminal of the amplifier is connected to ground through the series arrangement of a capacitor having a large capacitance and a resistor having a low resistance. The capacitor is required because the mean intensity of the deflection current must be substantially zero. Without the capacitor the amplifier would have to be fed from two voltage supply sources of opposite polarity, which would be cumbersome and expensive. A voltage which is fed back both with respect to direct current and alternating current to the input of the amplifier is produced across the said series arrangement. The d.c. feedback has for its purpose to stabilize the mean current in the amplifier while the a.c. feedback causes the deflection current to have the desired variation. Frequency-dependent feedback network are required for this purpose.

These networks together with a large feedback have, however, the result that the frequency characteristic of the amplifier exhibits a peak for very low frequencies, i.e. much lower than the field frequency of 50 or 60 Hz. When the DC component of the control signal applied to the amplifier undergoes a sudden variation, for example, as a result of a variation of the amplitude and/or of the frequency of this signal, an overshoot and/or a low frequency oscillation which is damped occurs in the deflection current. The picture displayed on the screen of the display tube then quickly moves up and down, which is very troublesome.

A similar effect is inhibited in the said patent in that the frequency characteristic for the very low frequencies decays quickly. In order to obtain a satisfactory linearity of the deflection current it is ensured that the control signal comprises very low frequency components because a parabola-shaped component is added to the sawtooth-shaped component.

A drawback of this step is the following. Since the sawtooth-shaped deflection current passes through the capacitor arranged in series with the deflection coil, a parabolic voltage is produced thereacross which, as already stated, is fed back to the input of the amplifier. It is obvious that the parabolic component of the control signal can be given such an amplitude that the two parabolic signals will compensate for each other. However, since the capacitance of the capacitor is very large, in the order of 1000$\mu$F or more, it is formed as an electrolytic capacitor. The spread in the capacitance of such capacitors is large so that the said compensation should actually be adjustable. The capacitance is also temperature-dependent. Consequently, serious and variable linearity errors may be produced.

An object of the invention is to obviate the above-mentioned disturbing effects while obtaining a satisfactory synchronization between the said components so that these linearity errors do not occur. The circuit arrangement according to the invention is characterized in that the circuit arrangement is also provided with a feedback alternating current path comprising a field frequency clamping circuit.

In one embodiment of the circuit arrangement according to the invention in which a capacitor is arranged in series with the deflection coil and in which at least part of the parabolic voltage caused across the capacitor by the deflection current is fed back to the second input terminal and in which the generator includes a field-frequency switch, the circuit arrangement is characterized in that a capacitor is arranged between the switch and the capacitor in series with the deflection coil.

Figure 2:
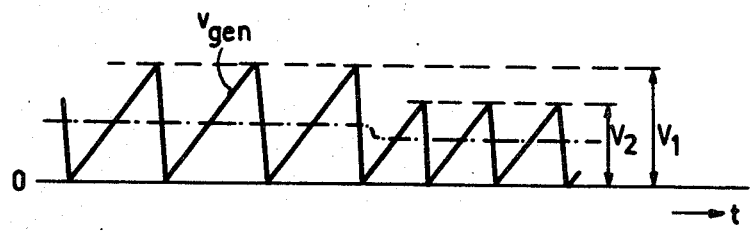
Figure 3:
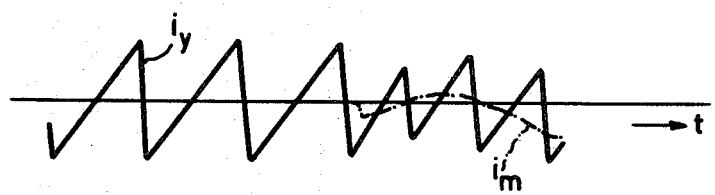
Figure 4:
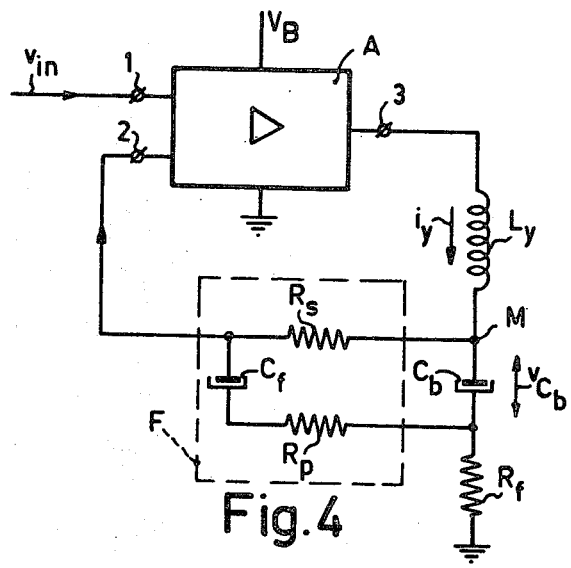

The invention will be described by way of example with reference to the accompanying Figures in which FIG. 1 shows a known circuit arrangement, FIG. 2 and 3 show waveforms which may occur therein, FIG. 4 shows a more complete embodiment of the circuit arrangement of FIG. 1, FIGS. 5, 6, 7, 8 and 9 show embodiments of the circuit arrangement according to the invention.

FIG. 1 shows a simplified principle circuit diagram of a known field circuit in which $L_y$ is a field deflection coil. A capacitive sawtooth generator includes a capacitor $C_c$ which is periodically charged by a current source $I_c$ (field trace time) and is discharged by a subsequently conducting switch S (field retrace time). The sawtooth-shaped voltage $v_{gen}$ thus generated across capacitor $C_c$ controls an input terminal 1 of an amplifier A which is fed from a supply voltage $V_B$ and which applies, through an output terminal 3, a deflection current $i_y$ to coil $L_y$ in series with which a capacitor $C_b$ of large value blocking the DC component is arranged. A resistor $R_f$ of low value is arranged in series with the capacitor $C_b$ and coil $L_y$ and the free end of this resistor as well as those of elements S, $I_c$ and $C_c$ are connected to ground. A voltage is present across the series network $C_b$, $R_f$ which is fed back through a feedback network F to a second input terminal 2 of amplifier A. Due to this step deflection current $i_y$ has substantially the same shape as the control voltage of the amplifier.

Some periods of voltage $v_{gen}$ are plotted in FIG. 2. Due to the clamping action against ground of switch S the minimum value of voltage $v_{gen}$ is zero. When the maximum value thereof varies between a value $V_1$ and a value $V_2$, for example, as a result of a variation in the frequency of switch S, the value of the d.c. component of voltage $v_{gen}$ will vary between $V_1/2$ and $V_2/2$. In spite of the fact that due to the presence of capacitor $C_b$ the mean intensity $i_m$ of current $i_y$ is zero over a long period, a temporary variation thereof will be produced which will be superimposed on the sawtooth (see FIG. 3). As a result the image displayed on the display screen of a picture tube (not shown) moves quickly up and down. This phenomenon may be further explained with reference to a practical example.

FIG. 4 shows a known field circuit in which the voltage across capacitor $C_b$, which is a direct voltage in a first approximation, is fed back through a resistor $R_s$ and in which the alternating voltage across feedback resistor $R_f$ is fed back through a capacitor $C_f$ to input terminal 2. Since the feedback network F thus formed has only two capacitors, a phase shift of 180° cannot be produced and hence no oscillation can be the result.

However, when the feedback voltage at terminal 2 is not very low relative to the control voltage $v_{in}$ at terminal 1, it is found that the total frequency characteristic of the circuit arrangement exhibits a peak at very low frequencies, i.e. lower than approximately 10 Hz. In case of a sudden variation as in FIG. 2 an overshoot and/or a damped oscillation occurs in the mean intensity $i_m$ of deflection current $i_y$ shown in FIG. 3.

This effect can be prevented by providing parallel across resistor $R_s$ a capacitor having a capacitance which is suitable relative to that of capacitor $C_f$. However, since the two capacitors have a very large capacitance they are formed as electrolytic capacitors so that the two capacitances exhibit a large spread and are temperature-dependent. The ratio thereof is thus not satisfactorily defined and may vary. It is better to provide a resistor $R_p$ in series with capacitor $C_f$, for resistors exhibit less spread and are not very temperature-dependent. In a practical embodiment having approximately the following values: $C_b = 2200\mu F$, $C_f = 1500\mu F$, $R_s = 560\Omega$, $R_f = 0.2\Omega$, voltage across $R_f = 1$ V peak-to-peak, open loop gain of amplifier A more than 26 dB, it was found that with a resistor $R_p$ of approximately $12\Omega$ the frequency characteristic substantially does not exhibit any peak at very low frequencies.

The described step, which is known per se, has the following drawback. Actually the voltage $v_C$ across capacitor $C_b$ is not a direct voltage, but a parabolic voltage. Due to the presence of resistor $R_p$ a parabolic voltage is also present at terminal 2. A serious linearity error of current $i_y$ may then be prevented if a parabolic voltage of opposite concavity and suitable amplitude is added to the control voltage $v_{in}$ at terminal 1. Since the amplitude of the voltage $v_C$ is dependent on the capacitance of capacitor $C_b$, it will, however, be dependent on the spreads and on the temperature. In case of electrolytic capacitors the capacitance may exhibit a variation of 20% at a temperature variation of 60°C.

Figure 5:
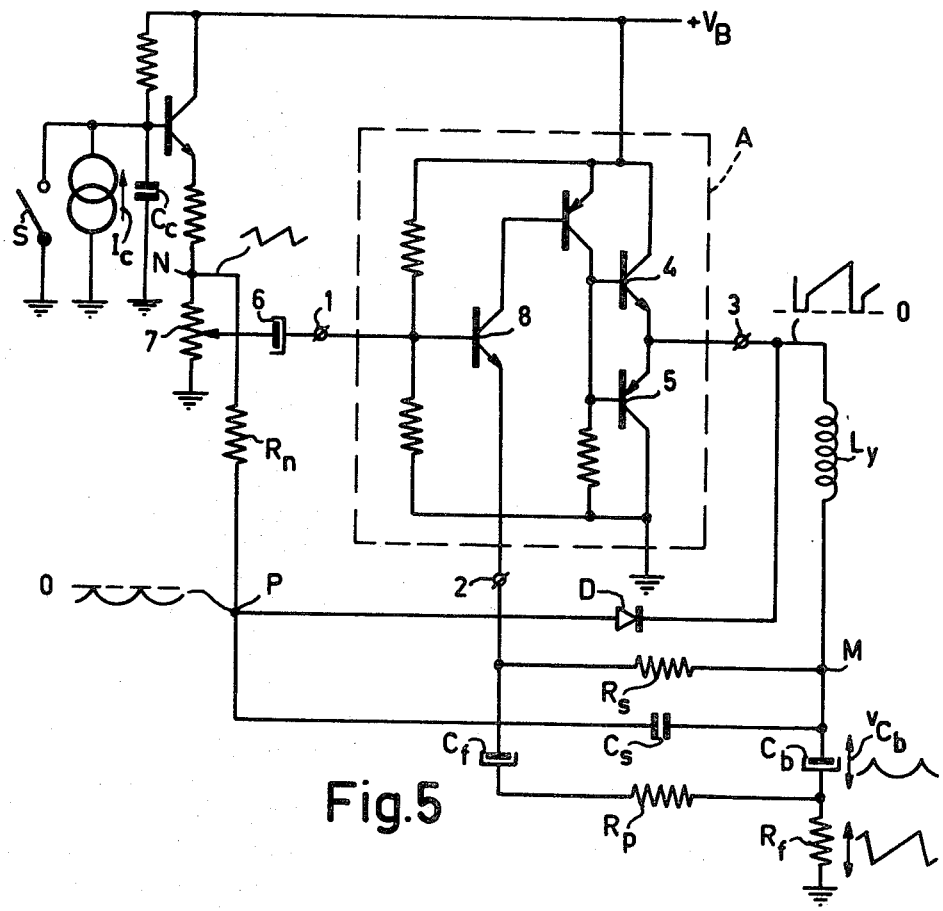

The invention is based on the recognition of the fact that the parabolic voltage across capacitor $C_b$ can be extra fed back to the input of amplifier A and this in such a manner that the parabolic voltage thus added to the control signal is in step with voltage $v_C$. FIG. 5 shows such an embodiment in which amplifier A is a class-B amplifier with two complementary transistors 4 and 5 whose emitters are connected together and to output terminal 3 while the collectors are connected to the voltage supply source $+V_B$ and ground. Input terminal 1 is connected through a capacitor 6 to the wiper on a potentiometer 7 on which potentiometer (point N) a sawtooth voltage originating from the sawtooth generator is present. Thus the vertical amplitude (the picture height) is adjusted with the aid of potentiometer 7. Amplifier A also includes a preamplifier transistor 8 whose base is connected to input terminal 1 and whose emitter is connected to terminal 2. The series arrangement of a capacitor $C_s$ and a resistor $R_n$ is connected between points M, the junction of coil $L_y$ and capacitor $C_b$, and N and a diode D is incorporated between terminal 3 and the junction P of resistor $R_n$ and capacitor $C_s$. The diode has the conducting direction shown in FIG. 5.

During at least the second half of the retrace time transistor 4 is cut off while transistor 5 is saturated. The potential at terminal 3 is then the same as that of ground. The parabolic voltage present on point P is therefore clamped against this potential during the retrace time. By suitable choice of the ratio of the resistances of resistors $R_n$ and $R_p$ it can be ensured that the parabolic component transferred through resistor $R_n$ to point N always compensates for the parabolic component introduced by resistor $R_p$. Since one parabola is applied to the base of transistor 8 and the other is applied to its emitter, the influences thereof on the collector current are opposed. The linearity of deflection current $i_y$ no longer depends on the capacitance of capacitor $C_b$ and consequently does not depend on its variations. In order that the very low frequencies damped by resistor $R_p$ are not fed back, the described clamping circuit $C_s$, D is provided. The amplitude of components with a frequency which is much lower than that of the clamping pulses, i.e. the field frequency of 50 or 60 Hz, is considerably reduced by this circuit so that substantially no low frequency variation of the mean intensity of current $i_y$ occurs. For this purpose capacitor $C_s$ must be proportioned in such a manner that the charge collected during the trace time can be depleted again during the retrace time and that the parabola can be passed on without distortion. In one embodiment in which a potential other than that of ground is available during the retrace time the circuit arrangement of FIG. 5 may alternatively be used in which diode D has the then suitable conductivity direction. It is evident that the voltage level at which clamping takes place is of no importance, provided that it remains constant.

Figure 6:
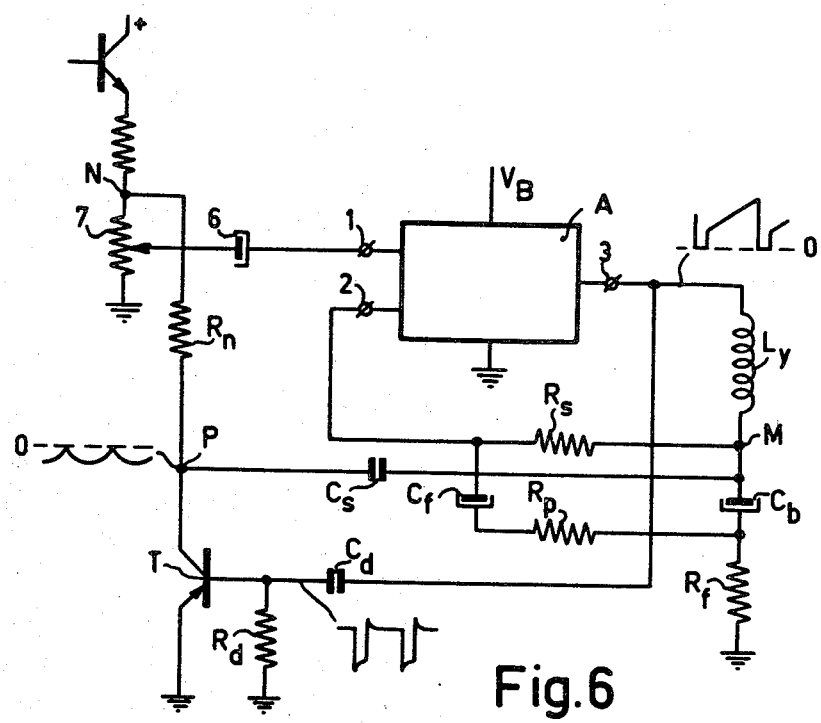

FIG. 6 shows a modification of the circuit arrangement according to the invention in which instead of a diode a transistor T is used. Retrace pulses are derived from the voltage at terminal 3 by means of a differentiating network $C_d$, $R_d$ and are applied to the base of transistor T. Such a step may be used if this voltage does not assume a fixed value during the retrace time. The polarity of the obtained pulses as well as the type of the transistor are chosen to be such that transistor T can only conduct during the retrace time. FIG. 6 shows the pulses as negative going while transistor T is of the pnp-type. Its emitter is connected to a fixed potential, for example, that of ground while the collector is connected to the junction P of resistor $R_n$ and capacitor $C_s$. When the voltage on point P, dependent on the fluctuations of the voltage on point M, is negative relative to the emitter voltage, transistor T conducts during the retrace time so that the voltage on point P is clamped substantially at the level of the emitter. When on the other hand this voltage is positive, the collector-base diode of transistor T conducts. Since the emitter-base diode also conducts due to the retrace pulses, a clamping action also takes place in this case.

Figure 7:
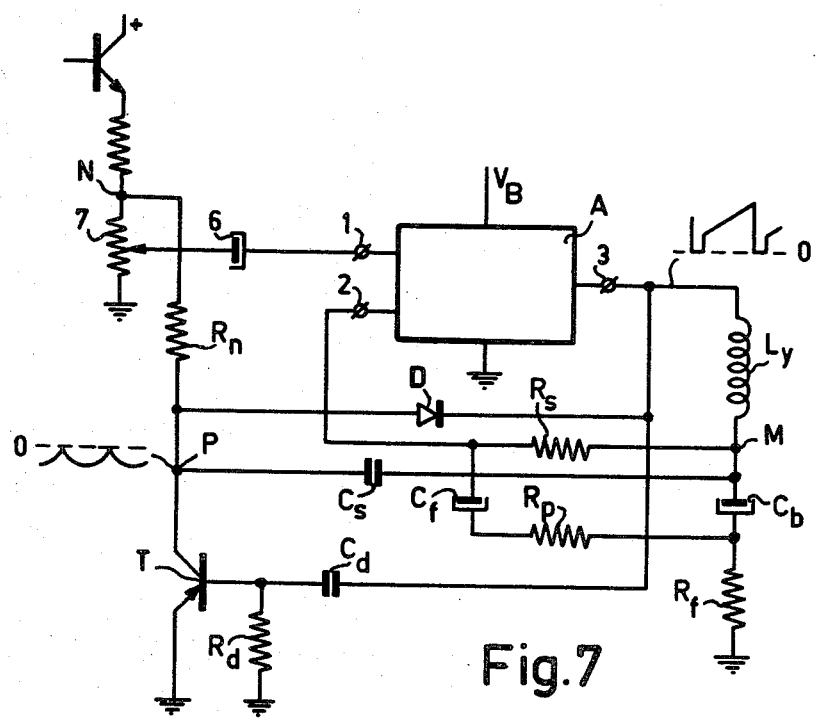

FIG. 7 shows an embodiment of the circuit arrangement according to the invention which is a combination of the embodiments of FIGS. 5 and 6 in which both the clamping diode D and the clamping transistor T are present and which may be used in the case where the clamping action by means of capacitor $C_d$ and the collector-base diode of transistor T is insufficient. Likewise as in FIG. 5, FIG. 7 utilizes the fact that the voltage on terminal 3 assumes a fixed value, in this case zero, during the retrace time.

Figure 8:
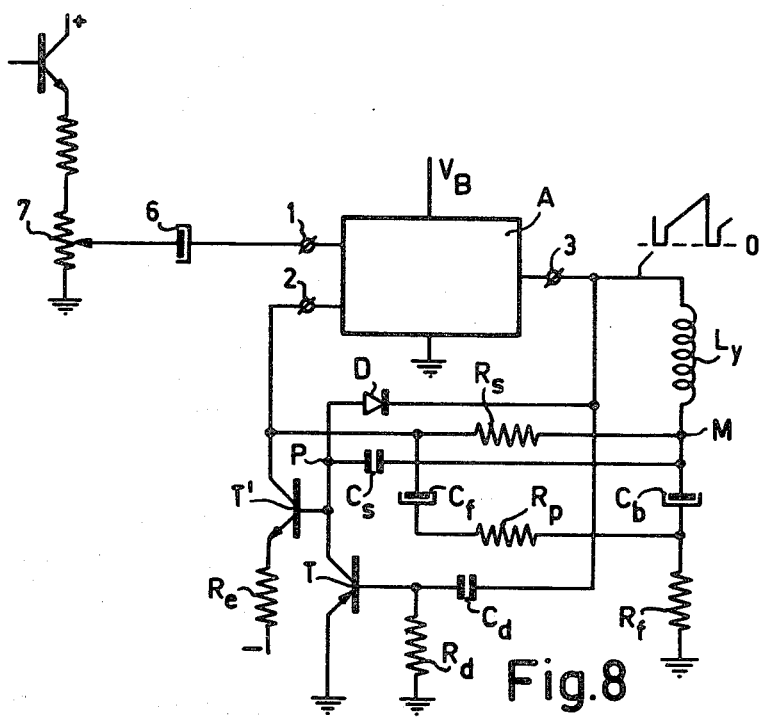

In the embodiment FIG. 8 a parabolic current is fed back to terminal 2 instead of a parabolic voltage fed back to terminal 1 as is the case in the embodiments according to FIGS. 5, 6 and 7. The parabolic voltage clamped by the same circuit as in FIG. 7, i.e. with a diode D and a transistor T undergoes a phase shift of 180° in FIG. 8 by means of an extra transistor T' whose collector is connected to terminal 2. In the embodiments of FIGS. 5, 6 and 7 a compensation in the control signal of amplifier A was referred to, but in FIG. 8 a compensation in the feedback path itself is concerned. A condition therefor is that the parabolic current impressed by transistor T' has the same intensity as the parabolic current caused by resistor $R_p$. Since the value of resistor $R_p$ is much lower than that of resistor $R_s$ (12 and 560 Ohms respectively in the above-mentioned example) the latter current is substantially equal to the voltage $v_{C_b}$ across capacitor $C_b$ divided by the resistance of resistor $R_s$. Said voltage is also present on point P so that the value of the emitter resistor $R_e$ of transistor T' must be substantially equal to that of resistor $R_2$. An embodiment according to FIGS. 5, 6 and 7, i.e. without an extra transistor, in which the compensating signal is not fed back to terminal 1 but to terminal 2 is of course feasible, provided that amplifier A is formed in such a manner that the parabolic signals compensate for each other.

Figure 9:
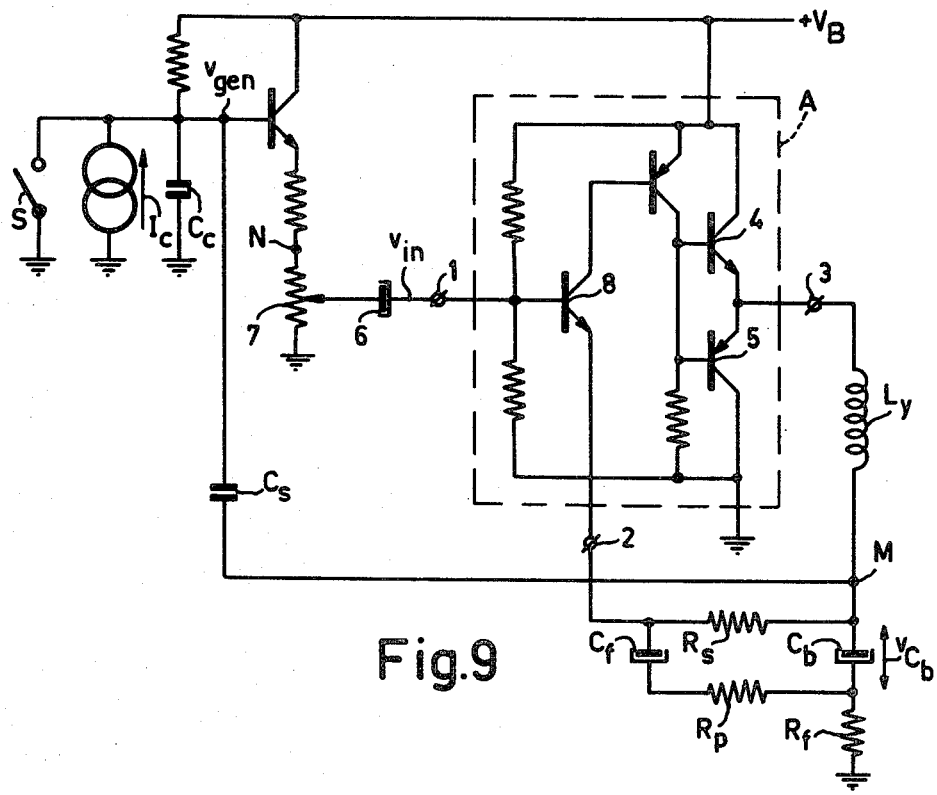

In the embodiments of FIGS. 5, 6, 7 and 8 a clamping circuit is used. In FIG. 9 the principle circuit diagram of an embodiment of the circuit arrangement according to the invention is shown in which the clamping action of switch S in the sawtooth generator is used so that an extra clamping circuit can be omitted altogether. Capacitor $C_s$ is provided in FIG. 9 between point M and the connection of capacitor $C_c$ not connected to ground. As a result thereof a parabolic voltage is present across capacitor $C_c$ whose amplitude is $$\frac{1/C_c}{1/C_c + 1/C_s} \cdot v_{c_b} = \frac{C_s}{C_s + C_c} \cdot v_{c_b},$$

in which $C_c$ and $C_s$ represent the capacitance of capacitors $C_c$ and $C_s$, respectively. The amplitude of the parabolic component on terminal 1 is:

$$\frac{v_{in}}{v_{gen}} \cdot \frac{C_s}{C_s + C_c} \cdot v_{c_b},$$

in which $v_{in}$ is the amplitude of the input voltage at terminal 1 and $v_{gen}$ is the amplitude of the voltage across capacitor $C_c$. The parabolic voltage across resistor $R_p$ has an amplitude of $$\frac{R_p}{R_p + R_s} \cdot v_{c_b}$$

where $R_p$ and $R_s$ are the values of resistors $R_p$ and $R_s$, respectively. Both calculated voltages must be equal for a correct compensation from which follows that:

$$\frac{C_c}{C_s} = \frac{R_p + R_s}{R_p} \cdot \frac{v_{in}}{v_{gen}} - 1 \approx \frac{R_s}{R_p} \cdot \frac{v_{in}}{v_{gen}} - 1$$

because $R_p$ is much lower than $R_s$.

It will be noted that capacitor $C_s$ is parallel across capacitor $C_c$ as regards the sawtooth generator so that the capacitance of capacitor $C_c$ must be adapted to this situation. The sawtooth-shaped voltage present across resistor $R_f$ is also fed back, however, with a factor $$\frac{R_p}{R_p + R_s}$$

which is negligible. It is true that the ratio $$\frac{C_c}{C_s}$$

in the above formula depends on ratio $$\frac{v_{in}}{v_{gen}}$$

and therefore on the position of potentiometer 7. The spread thereof is, however, small because the required amplitude of the deflection current needs little spread and in addition is reduced by the feedback. In practice it has been found that the variation of ratio $$\frac{C_c}{C_s}$$

as a result of a variation of $$\frac{v_{in}}{v_{gen}}$$

is still smaller than the spread caused by tolerances in the capacitances.

It will be noted that the circuit arrangement according to FIG. 9, which has the advantage that it requires only one capacitor, is only possible if the polarity of the output signal of amplifier A is the same as that of the signal generated by the sawtooth generator. When this is not the case an extra clamping circuit must be introduced such as for example in FIGS. 5, 6, 7 and 8 in which field retrace pulses, for example, those produced at terminal 3 must be used.

Since the very low frequency components are considerably reduced, but have not completely disappeared, a small error will remain. However, it has been found by experiments with the circuit arrangement according to FIG. 9 and with the mentioned values of elements $C_b$, $C_f$, $R_s$ and $R_f$ that the occurring overshoot is reduced to less than 5% of its original uncorrected value while this phenomenon takes approximately 0.1 s which is by all means acceptable.

It will be noted that all described embodiments of the circuit arrangement according to the invention are based on the known circuit arrangement of FIG. 4. It will be evident that the scope of the invention is not limited thereto. Other feedback networks are known in which one or more capacitors of high value are present and in which the described step may be used. It will also be evident that the clamping pulses need not necessarily be retrace pulses, although this is of course more practical. Also a clamping circuit is possible in which a level diode is used, for example, the circuit arrangement of FIG. 5 with the cathode of diode D to ground. It is, however, clear that a circuit arrangement with clamping pulses has a better effect and gives the parabola the least distortion.

I claim:

1. A circuit arrangement for generating a sawtooth deflection current in a field deflection coil, said circuit comprising means for generating a sawtooth-shaped control signal; an amplifier having a first input terminal coupled to said generating means, a second input terminal, and an output means for coupling to said coil; low and high frequency feedback paths coupled to said second input terminal; a capacitor adapted to be coupled to said coil, whereby a parabolic voltage is developed thereacross; means for feeding back at least a portion of said parabolic voltage to said second terminal; and means for substantially eliminating overshoots and very low frequency oscillations in the mean value of said deflection current comprising an alternating current conducting field frequency clamping path means coupled between said output terminal and one of said input terminals for applying said parabolic voltage thereto.

2. A circuit arrangement as claimed in claim 1, wherein the feedback alternating current path and clamping means comprises the arrangement of a capacitor and a resistor coupled to said capacitor and a diode coupled to the junction of said capacitor and the resistor and controlled by retrace pulses.

3. A circuit arrangement as claimed in claim 1, wherein the feedback alternating current path and the clamping means include the arrangement of a capacitor and a resistor coupled to said capacitor and first transistor coupled to the junction of said capacitor and the resistor and controlled by retrace pulses.

4. A circuit arrangement as claimed in claim 3, further comprising a second transistor having a base controlled by said first transistor, a collector coupled to the second input terminal, and an emitter lead; a resistor coupled to said emitter; and a resistor present in the feedback path for very low frequencies having a resistance substantially equal to said emitter lead resistor.

5. A circuit arrangement as claimed in claim 1, wherein the generator includes a field frequency switch and further comprising a capacitor coupled between the switch and the capacitor in series with the deflection coil.

6. A circuit arrangement as claimed in claim 1 wherein the generator also includes a capacitor shunted by the switch, both the feedback path for very low frequencies and the feedback path for high frequencies each include a resistor, the ratio between the capacitance $C_s$ of the capacitor between the switch and the capacitor in series with the deflection coil is substantially given by the formula $$\frac{C_c}{C_s} = \frac{R_p + R_s}{R_p} \cdot \frac{v_{in}}{v_{gen}} - 1$$

where $R_s$ is the resistance of the resistor in the feedback path for very low frequencies, $R_p$ is the resistance of the resistor in the feedback path for higher frequencies, $v_{in}$ is the amplitude of the control voltage at the first input terminal, and $v_{gen}$ is the amplitude of the voltage generated by the generator.

* * * * *